United States Patent
Katakura et al.

(10) Patent No.: US 6,873,830 B2
(45) Date of Patent: Mar. 29, 2005

(54) BIAS CIRCUIT AND RADIO COMMUNICATION APPARATUS USING SAME

(75) Inventors: Masayuki Katakura, Kanagawa (JP); Hideshi Motoyama, Kanagawa (JP)

(73) Assignee: Sony Corporation (JP)

( * ) Notice: Subject to any disclaimer, the term of this patent is extended or adjusted under 35 U.S.C. 154(b) by 705 days.

(21) Appl. No.: 09/852,273

(22) Filed: May 10, 2001

(65) Prior Publication Data

US 2002/0009980 A1 Jan. 24, 2002

(30) Foreign Application Priority Data

May 12, 2000 (JP) ..................................... P2000-139480

(51) Int. Cl.⁷ ................................................ H04B 1/04
(52) U.S. Cl. ................................ 455/127.1; 455/115.1; 455/127.3; 327/563; 330/261; 330/296
(58) Field of Search .......................... 455/127.1–127.5, 455/115.1–115.4, 234.1, 71; 327/563, 361, 252; 330/254, 259, 261, 272, 285, 296

(56) References Cited

U.S. PATENT DOCUMENTS

| | | | | |
|---|---|---|---|---|
| 3,733,551 A | * | 5/1973 | Augenblick et al. | 455/127.1 |
| 4,881,044 A | * | 11/1989 | Kinoshita et al. | 330/261 |
| 5,221,909 A | * | 6/1993 | Cole | 330/261 |
| 5,239,275 A | * | 8/1993 | Leitch | 455/127.3 |
| 5,280,199 A | * | 1/1994 | Itakura | 330/261 |
| 5,287,070 A | * | 2/1994 | Thelen et al. | 330/261 |
| 5,530,395 A | * | 6/1996 | Ting | 327/543 |
| 5,999,050 A | * | 12/1999 | Baltus | 330/261 |
| 6,084,471 A | * | 7/2000 | Ruth et al. | 330/254 |
| 6,124,761 A | * | 9/2000 | Robinson et al. | 330/254 |
| 6,137,350 A | * | 10/2000 | Maeda | 327/563 |
| 6,259,901 B1 | * | 7/2001 | Shinomiya et al. | 455/127.3 |
| 6,300,811 B1 | * | 10/2001 | Dick | 327/252 |
| 6,711,391 B1 | * | 3/2004 | Walker et al. | 455/234.1 |

* cited by examiner

*Primary Examiner*—Edward F. Urban
*Assistant Examiner*—Lana Le
(74) *Attorney, Agent, or Firm*—Rader, Fishman & Grauer PLLC; Ronald P. Kananen (57) ABSTRACT

A bias circuit according to the present invention includes a monitoring circuit having a second FET and a resistance connected to a drain of the second FET for monitoring a drain current of a first FET to be supplied with a gate bias; a differential circuit including a third FET having a gate supplied with a reference voltage, a fourth FET having a gate connected to the drain of the second FET, sources of the third FET and the fourth FET being connected to a common point, and resistances connected to drains of the third FET and the fourth FET, respectively; and a fifth FET having a drain connected to the common source of the third FET and the fourth FET; wherein a drain voltage of the third FET is fed back to gates of the first FET and the second FET, and a drain voltage of the fourth FET is fed back to a gate of the fifth FET.

10 Claims, 4 Drawing Sheets

BIAS CIRCUIT AND RADIO COMMUNICATION APPARATUS USING SAME

BACKGROUND OF THE INVENTION

The present invention relates to a bias circuit and a radio communication apparatus using the same, and particularly to a bias circuit for supplying a bias voltage to a gate of a FET and a radio communication apparatus such as a cellular telephone or a cordless telephone using the same as a gate bias circuit for an RF amplifying FET in a transmission system thereof.

In a radio frequency (RF) band, especially a microwave band, an N-channel FET having excellent RF characteristics, such as a GaAs FET, is used. In a circuit using the FET, a conventional bias circuit for providing a bias voltage to a gate of the FET is generally configured to use a divided voltage obtained by dividing power supply voltage by resistance as a gate bias voltage for the FET.

The gate bias voltage of the thus configured bias circuit for the FET is uniquely determined by the voltage dividing resistances. On the other hand, radio frequency FETs such as GaAs FETs greatly vary in threshold voltage Vth between production lots, and therefore the resistance division system in which the gate bias voltage is uniquely determined produces a great variation in idle current Idsq.

Thus, because of the variation in idle current Idsq, the conventional bias circuit employing the resistance division system cannot deliver specified performance, thereby requiring adjustment such as changing the voltage dividing resistances. Moreover, since the bias voltage of the conventional bias circuit obtained by the resistance division system is fixed, a variation in characteristics of the FET due to temperature variation or the like causes the idle current Idsq to vary according to the variation in characteristics of the FET.

SUMMARY OF THE INVENTION

The present invention has been made in view of the above problems, and it is accordingly an object of the present invention to provide a bias circuit and a radio communication apparatus using the same that make it possible to keep the idle current constant irrespective of variation in characteristics of FETs between FET production lots and change in characteristics of the FETs due to temperature variation or the like, and also to reduce current consumption to a low level.

To achieve the above object, according to an aspect of the present invention, there is provided a bias circuit, including: a monitoring circuit having a second FET and a resistance connected to a drain of the second FET for monitoring a drain current of a first FET to be supplied with a gate bias; a differential circuit including a third FET having a gate supplied with a reference voltage, a fourth FET having a gate connected to the drain of the second FET, a source of the third FET and that of the fourth FET being connected to a common point, and resistances connected to drains of the third FET and the fourth FET, respectively; and a fifth FET having a drain connected to the common source of the third FET and the fourth FET; wherein a drain voltage of the third FET is fed back to a gate of the first FET and that of the second FET, and a drain voltage of the fourth FET is fed back to a gate of the fifth FET.

According to the bias circuit having the above configuration monitors the drain current of the first FET through the second FET by means of the resistance, and compares a voltage drop at the resistance with the reference voltage by means of the third FET and the fourth FET of the differential circuit. Then, the bias circuit feeds the drain voltage of the third FET back to the gates of the first FET and the second FET, and feeds the drain voltage of the fourth FET back to the gate of the fifth FET. Thus, when power supply voltage or FET threshold voltage deviates from a standard value, the currents of the third FET and the fourth FET are kept equal to each other, and hence the voltage drop at the current monitoring resistance is kept equal to the reference voltage

DETAILED DESCRIPTION OF PREFERRED EMBODIMENTS

Preferred embodiments of the present invention will hereinafter be described in detail with reference to the drawings.
[First Embodiment]

Figure 1:
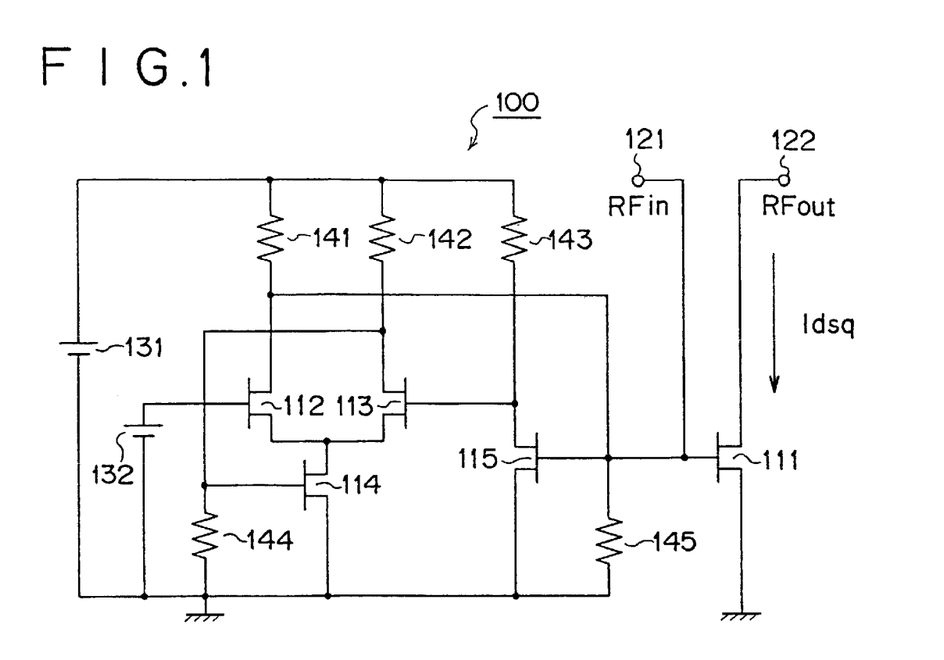
FIG. 1 is a circuit diagram of a bias circuit according to a first embodiment of the present invention.

FIG. 1 is a circuit diagram of a bias circuit according to a first embodiment of the present invention. In FIG. 1, an RF amplifying FET 111 has a source grounded, a gate connected to an input terminal 121, and a drain connected to an output terminal 122. A gate bias voltage obtained in a bias circuit 100 is applied to the gate of the RF amplifying FET 111.

In the bias circuit 100, one end of each of load resistances 141 and 142 and a current monitoring resistance 143 is connected to a common positive electrode of a reference voltage source 131. A negative electrode of the reference voltage source 131 is grounded. The other ends of the load resistances 141 and 142 are connected to drains of FETs 112 and 113, respectively. The FETs 112 and 113 have sources connected to a common point, and thereby form a differential pair. More specifically, the FETs 112 and 113 and the load resistances 141 and 142 comprise a differential amplifier (differential circuit).

A gate of the FET 112 is connected to a positive electrode of a reference voltage source 132. A negative electrode of the reference voltage source 132 is grounded. A gate of the FET 113 is connected to the other end of the current monitoring resistance 143. The common source of the FETs 112 and 113 is connected to a drain of a FET 114. The FET 114 has a source grounded and a gate connected to the drain of the FET 113 and one end of a resistance 144, and functions as a common source current source for the differential pair FETs 112 and 113. The other end of the resistance 144 is grounded.

The gate of the FET 113 is connected to a drain of a FET 115. A source of the FET 115 is grounded, while its gate is connected to the drain of the FET 112 and one end of a resistance 145. The other end of the resistance 145 is grounded. The gate of the FET 115 is also connected to the gate of the RF amplifying FET 111. Thus, the FET 115 and the current monitoring resistance 143 connected to the drain of the FET 115 comprise a monitoring circuit for monitoring drain current of the RF amplifying FET 111.

In the configuration described above, a scaling law is set to hold between the FET 111 and the FET 115, or is set to hold with a certain offset between the FET 111 and the FET 115. A scaling law is a relational law describing how design parameters such as capacitance, resistance, wiring delay time, and power consumption are changed when device dimensions such as gate length and gate width are scaled up or scaled down.

Operation of the bias circuit 100 according to the first embodiment thus configured will next be described. In this case, a threshold voltage Vth of each of the FET 111 and the FET 115 do not necessarily need to be of the same value, and the values may have an offset. For simple description, however, consideration will be given to a case where threshold voltages Vth of the FET 111 and the FET 115 are of the same value.

When the threshold voltage Vth of the RF amplifying FET 111 is low, that of the FET 115 having the same threshold voltage Vth value is also low. Since the threshold voltage Vth of the FET 115 is low, a drain-to-source current of the FET 115 is increased, while a voltage applied to the gate of the FET 113 is decreased. Then, a drain-to-source current of the FET 113 is decreased.

When the drain-to-source current of the FET 113 is decreased, a voltage applied to the gate of the FET 114 is increased. Then, a drain-to-source current of the FET 114 is increased. Hence, a drain-to-source current of the FET 112 is increased, and voltage applied to the gates of the FETs 111 and 115 is decreased. Then, current flowing through the FETs 111 and 115 is decreased.

Thus, when the FET 111 has a low threshold voltage Vth and a great idle current Idsq, the bias circuit 100 functions to decrease the idle current Idsq. On the other hand, when the FET 111 has a high threshold voltage Vth and a low idle current Idsq, the bias circuit 100 functions to increase the idle current Idsq.

The circuit is then stabilized in a certain state of equilibrium. When this stable state provides a desired idle current Idsq, the idle current Idsq can be kept constant irrespective of difference in the threshold voltage Vth of the FET. As the FETs 111 and 115 also vary in characteristics due to temperature variation or the like, the idle current Idsq is kept constant.

This is because when the idle current Idsq of the FET 111 is increased due to temperature variation, the drain-to-source current of the FET 115 is simultaneously increased, and therefore the bias circuit 100 functions to decrease the idle current Idsq; and when the idle current Idsq is decreased, the bias circuit 100 functions to increase the idle current Idsq.

Even in a case where a scaling law holds with an offset between the FET 111 and the FET 115, when circuit constants are determined in consideration of the amount of the offset, the idle current Idsq is kept constant for the same reason as described above.

Description will next be made of a feedback from the drain of the FET 113 to the FET 114, or the common source current source for the differential pair FETs 112 and 113 (hereinafter referred to as common mode feedback), which feedback has been devised for accurate operation of the bias circuit 100.

For accurate operation of the bias circuit 100, voltage of the reference voltage source 132 and a voltage drop at the current monitoring resistance 143 need to be kept substantially the same irrespective of conditions. In order to achieve this, gate-to-source voltages of the FETs 112 and 113 must not vary greatly with conditions. However, a current flowing through the load resistance 141 varies depending on the threshold voltage Vth of the FETs 111 and 114 as well as power supply voltage (voltage of the reference voltage source 131).

Hence, when the FET 114 is a constant-current source, it is not possible to keep currents of the FETs 112 and 113 constant irrespective of conditions. While the above-mentioned condition may be satisfied by replacing the load resistance 141 with a current source if a P-channel FET or a depletion mode N-channel FET can be used, it is difficult to form a current source of the current source type only with an N-channel FET and a resistance.

As one method, current densities of the differential pair FETs 112 and 113 may be set very small so that the FETs operate in the vicinity of the threshold voltage Vth. However, lowering the current densities means setting size of the FETs 112 and 113 larger, thereby resulting in larger chip size.

Thus, the bias circuit 100 according to the first embodiment is configured to change the current of the FET 113 according as the current of the FET 112 varies, rather than keep the currents of the load resistance 141 and the FET 112 constant.

First, sizes and currents of the FETs 111, 115, and 114 are set such that the gate-to-source voltages of the FETs 111 and 115 become substantially equal to that of the FET 114 under normal operating conditions. Suppose that the power supply voltage is increased, for example. In order that the currents of the FETs 111 and 115 are kept constant, the amount of change in the power supply voltage needs to be absorbed as a change in the voltage drop of the load resistance 141. Thus, the current of the FET 112 has to be increased.

When the FET 114 is a constant-current source, the increase in the current of the FET 112 causes a decrease in the current of the FET 113, which results in a great difference between the drain-to-source voltages of the FETs 112 and 113. Therefore, the voltage of the reference voltage source 132 and the voltage drop at the current monitoring resistance 143 cannot be kept constant and the currents of the FETs 111 and 115 are inevitably varied due to variation in the power supply voltage.

When the power supply voltage is increasing, the bias circuit 100 according to the first embodiment acts to increase the gate-to-source voltage of the FET 114 via the load resistance 142, thereby increasing its current. Thus, the gate-to-source voltage of the FET 114 is not greatly changed while its current is increased, whereby the current of the FET 113 is also increased. As a result, the currents of the FETs 112 and 113 are kept substantially equal to each other, and the voltage drop at the resistance 143 is kept equal to the reference voltage of the reference voltage source 132. It is self-evident that the same substantially holds true even when the threshold voltages Vth of the FETs are changed, and therefore its description will be omitted.

As described above, the bias circuit 100 according to the first embodiment senses variation in the current of the FET 115 having the same threshold voltage vth as the RF amplifying FET 111 or having the same threshold voltage Vth as the RF amplifying FET 111 with some offset, and then functions to keep the idle current Idsq flowing through the RF amplifying FET 111 constant at all times. Therefore, it is possible to keep the idle current Idsq constant irrespective of variation in the threshold voltage Vth of the FETs. In addition, since the FETs satisfy the scaling law, the gate width of the FET 115 can be made substantially smaller than that of the RF amplifying FET 111, thereby making it possible to reduce current consumption to a low level.

Moreover, the FET 115 for monitoring the threshold voltage Vth of the FET 111 is supplied with voltage via the differential circuit formed by the FETs 112 and 113, and therefore is insensitive to variation in the reference voltages of the reference voltage sources 131 and 132. Furthermore, when the FET 111 is varied in characteristics due to temperature variation or the like, the FET 115 simultaneously varies in characteristics, and thus the idle current Idsq is kept constant. The bias circuit 100 as described above can be formed simply by limited circuit components such as N-channel FETs and resistances only.

[Second Embodiment]

Figure 2:
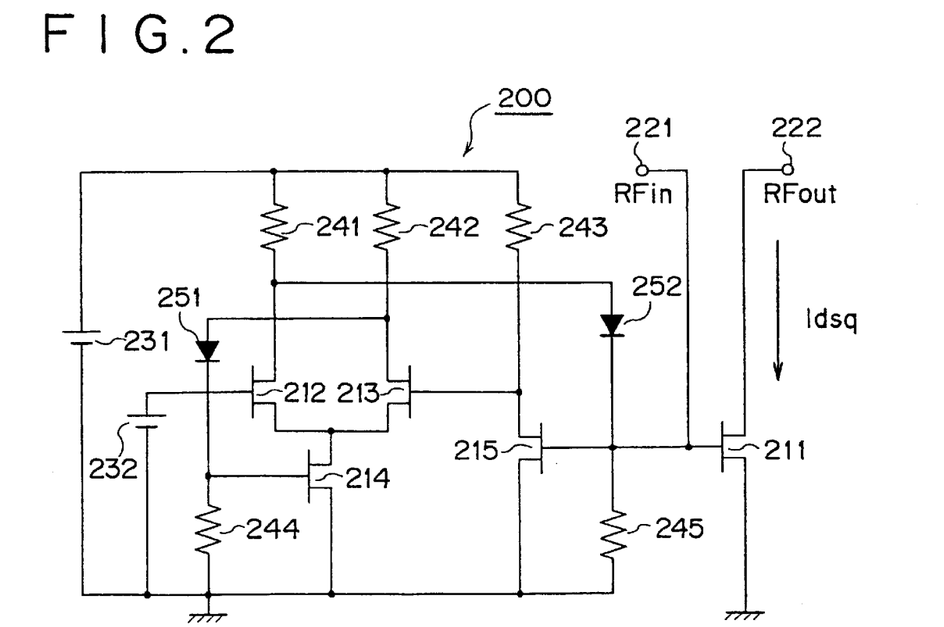
FIG. 2 is a circuit diagram of a bias circuit according to a second embodiment of the present invention.

FIG. 2 is a circuit diagram of a bias circuit according to a second embodiment of the present invention. In FIG. 2, an RF amplifying FET 211 has a source grounded, a gate connected to an input terminal 221, and a drain connected to an output terminal 222. A gate bias voltage obtained in a bias circuit 200 is applied to the gate of the RF amplifying FET 211.

In the bias circuit 200, one end of each of load resistances 241 and 242 and a current monitoring resistance 243 is connected to a common positive electrode of a reference voltage source 231. A negative electrode of the reference voltage source 231 is grounded. The other ends of the load resistances 241 and 242 are connected to drains of FETs 212 and 213, respectively. The FETs 212 and 213 have sources connected to a common point, and thereby form a differential pair.

A gate of the FET 212 is connected to a positive electrode of a reference voltage source 232. A negative electrode of the reference voltage source 232 is grounded. A gate of the FET 213 is connected to the other end of the current monitoring resistance 243. The common source of the FETs 212 and 213 is connected to a drain of a FET 214.

The FET 214 has a source grounded and a gate connected to one end of a resistance 244, and functions as a common source current source for the differential pair FETs 212 and 213. The other end of the resistance 244 is grounded. The gate of the FET 214 is connected to a cathode of a diode 251. An anode of the diode 251 is connected to the drain of the FET 213.

The gate of the FET 213 is connected to a drain of a FET 215. A source of the FET 215 is grounded, while its gate is connected to a cathode of a diode 252 and one end of a resistance 245. An anode of the diode 252 is connected to the drain of the FET 212. The other end of the resistance 245 is grounded. The gate of the FET 215 is also connected to the gate of the RF amplifying FET 211.

Operation of the bias circuit 200 according to the second embodiment thus configured will next be described.

When the threshold voltage Vth of the RF amplifying FET 211 is low, that of the FET 215 having the same threshold voltage Vth value is also low. Since the threshold voltage Vth of the FET 215 is low, a drain-to-source current of the FET 215 is increased, while a voltage applied to the gate of the FET 213 is decreased. Then, a drain-to-source current of the FET 213 is decreased, while a voltage applied to the anode of the diode 251 is increased.

Since a voltage drop of the diode may be considered constant, a voltage applied to the gate of the FET 214 is increased. Then, a drain-to-source current of the FET 214 is increased. Hence, a drain-to-source current of the FET 212 is increased, while voltage applied to the anode of the diode 252 is decreased. As a result of a voltage drop at the diode 252, voltage applied to the gates of the FETs 211 and 215 is decreased, and then the drain-to-source current of the FET 215 is decreased.

Since a current flowing through the gate of the RF amplifying FET 211 is negligible, voltages applied to the gates of the FETs 211 and 215 may be considered equal to each other. Hence, when the FET 211 has a low threshold voltage Vth and a great idle current Idsq, the bias circuit 200 functions to decrease the idle current Idsq. On the other hand, when the FET 211 has a high threshold voltage Vth and a low idle current Idsq, the bias circuit 200 functions to increase the idle current Idsq.

The circuit is then stabilized in a certain state of equilibrium. When this stable state provides a desired idle current Idsq, the idle current Idsq can be kept constant irrespective of difference in the threshold voltage Vth of the FET. As the FETs 211 and 215 also vary in characteristics due to temperature variation or the like, the idle current Idsq is kept constant.

Figure 3:
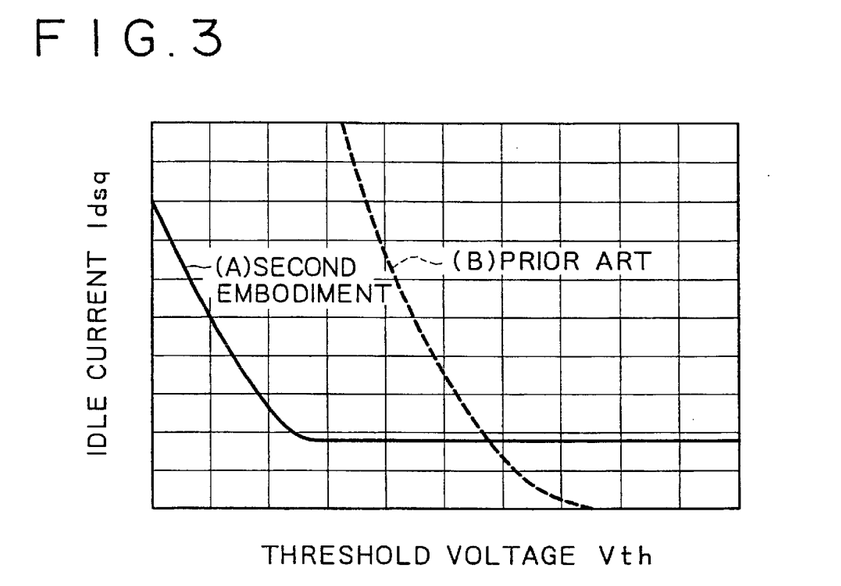
FIG. 3 is a Vth-Idsq characteristic diagram, showing a simulation result for the bias circuit according to the second embodiment.

A simulation result for the bias circuit 200 according to the second embodiment is shown in FIG. 3. In the figure, a solid line (A) indicates a result for the second embodiment, and a dotted line (B) indicates a result for prior art. As is clear from the simulation results, idle current Idsq of the prior art (B) is monotonously decreased with threshold voltage Vth, whereas the second embodiment (A) has a region where the idle current Idsq is constant with respect to threshold voltage Vth.

The bias circuit 200 according to the second embodiment is formed by adding the diodes 251 and 252 to the bias circuit 100 according to the first embodiment. Thus, in addition to the foregoing effects of the bias circuit 100 according to the first embodiment, the bias circuit 200 according to the second embodiment provides an effect of allowing the differential pair FETs 212 and 213 and the current source FET 214 to operate in a saturation region even when the gate voltages of the FETs 211 and 215 are set low.

[Third Embodiment]

Figure 4:
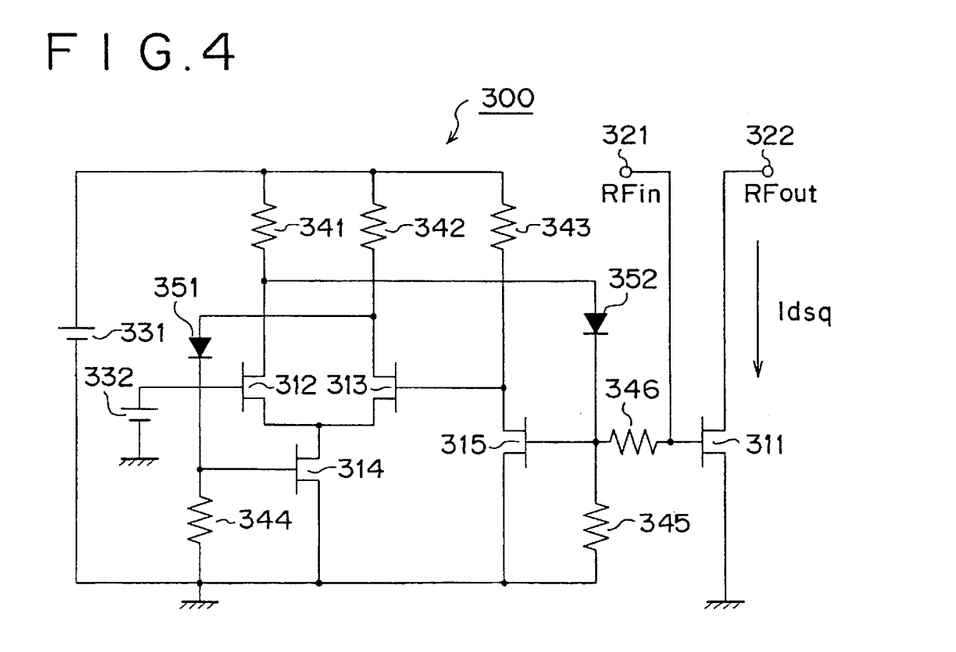
FIG. 4 is a circuit diagram of a bias circuit according to a third embodiment of the present invention.

FIG. 4 is a circuit diagram of a bias circuit according to a third embodiment of the present invention. In FIG. 4, an RF amplifying FET 311 has a source grounded, a gate connected to an input terminal 321, and a drain connected to an output terminal 322. A gate bias voltage obtained in a bias circuit 300 is applied to the gate of the RF amplifying FET 311.

In the bias circuit 300, one end of each of load resistances 341 and 342 and a current monitoring resistance 343 is connected to a common positive electrode of a reference voltage source 331. A negative electrode of the reference voltage source 331 is grounded. The other ends of the load resistances 341 and 342 are connected to drains of FETs 312 and 313, respectively. The FETs 312 and 313 have sources connected to a common point, and thereby form a differential pair.

A gate of the FET 312 is connected to a positive electrode of a reference voltage source 332. A negative electrode of the reference voltage source 332 is grounded. A gate of the FET 313 is connected to the other end of the current monitoring resistance 343. The common source of the FETs 312 and 313 is connected to a drain of a FET 314.

The FET 314 has a source grounded and a gate connected to one end of a resistance 344, and functions as a common source current source for the differential pair FETs 312 and 313. The other end of the resistance 344 is grounded. The gate of the FET 314 is connected to a cathode of a diode 351. An anode of the diode 351 is connected to the drain of the FET 313.

The gate of the FET 313 is connected to a drain of a FET 315. A source of the FET 315 is grounded, while its gate is connected to a cathode of a diode 352 and one end of a resistance 345. An anode of the diode 352 is connected to the drain of the FET 312. The other end of the resistance 345 is grounded. The gate of the FET 315 is also connected to one end of a resistance 346. The other end of the resistance 346 is connected to the gate of the RF amplifying FET 311.

The thus configured bias circuit 300 according to the third embodiment is formed by inserting the resistance 346 between the gate of the FET 311 and the gate of the FET 315 in the bias circuit 200 according to the second embodiment. Thus, in addition to the foregoing effects of the bias circuit 200 according to the second embodiment, the bias circuit 300 according to the third embodiment has an effect of the resistance 346 preventing an RF signal to be inputted to the RF amplifying FET 311 from being inputted to the bias circuit 300.

Since a current flowing through the gate of the FET is generally negligible, it is considered that a voltage supplied from the diode 352 is applied as it is to the gate of the RF amplifying FET 311. However, when the current flowing through the gate of the RF amplifying FET 311 is great and a voltage drop at the resistance 346 affects the bias, an inductor may be used instead of the resistance 346. This makes it possible to block input of an RF signal into the bias circuit 300 without producing a voltage drop due to the gate current.

It is to be noted that the third embodiment has been described by taking as an example a case where the resistance 346 (or an inductor) is added to the bias circuit 200 according to the second embodiment; however, the third embodiment may of course be similarly applied to the bias circuit 100 according to the first embodiment.

[Fourth Embodiment]

Figure 5:
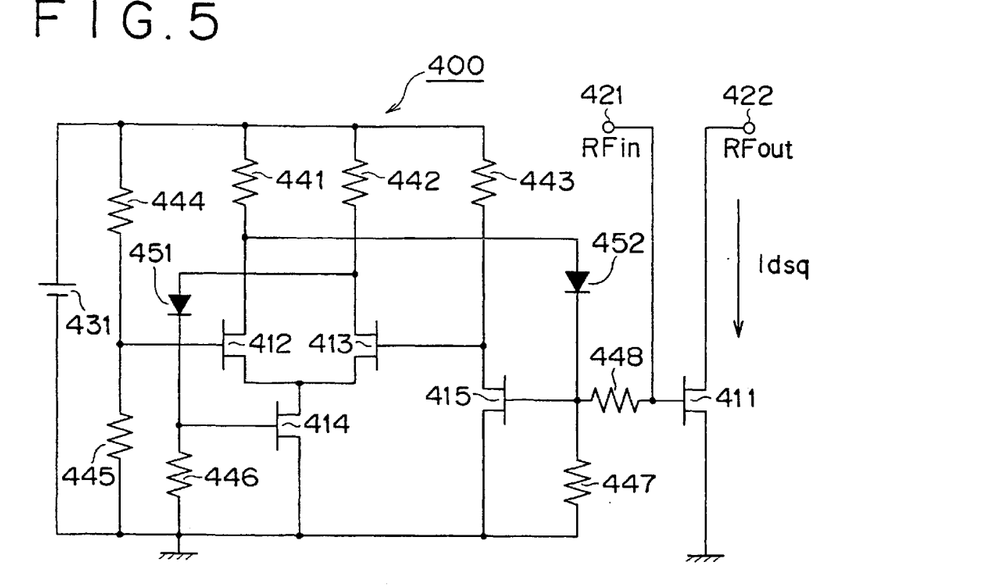
FIG. 5 is a circuit diagram of a bias circuit according to a fourth embodiment of the present invention.

FIG. 5 is a circuit diagram of a bias circuit according to a fourth embodiment of the present invention. In FIG. 5, an RF amplifying FET 411 has a source grounded, a gate connected to an input terminal 421, and a drain connected to an output terminal 422. A gate bias voltage obtained in a bias circuit 400 is applied to the gate of the RF amplifying FET 411.

In the bias circuit 400, one end of each of load resistances 441 and 442 and a current monitoring resistance 443 is connected to a common positive electrode of a reference voltage source 431. A negative electrode of the reference voltage source 431 is grounded. The other ends of the load resistances 441 and 442 are connected to drains of FETs 412 and 413, respectively. The FETs 412 and 413 have sources connected to a common point, and thereby form a differential pair.

A gate of the FET 412 is connected to one end of each of dividing resistances 444 and 445. The other end of the dividing resistance 444 is connected to the positive electrode of the reference voltage source 431. The other end of the dividing resistance 445 is grounded. Thus, the dividing resistances 444 and 445 divide voltage (power supply voltage) of the reference voltage source 431, and apply the divided voltage to the gate of the FET 412 as a reference voltage.

A gate of the FET 413 is connected to the other end of the current monitoring resistance 443. The common source of the FETs 412 and 413 is connected to a drain of a FET 414.

The FET 414 has a source grounded and a gate connected to one end of a resistance 446. The other end of the resistance 446 is grounded. The gate of the FET 414 is connected to a cathode of a diode 451. An anode of the diode 451 is connected to the drain of the FET 413.

The gate of the FET 413 is connected to a drain of a FET 415. A source of the FET 415 is grounded, while its gate is connected to a cathode of a diode 452 and one end of a resistance 447. An anode of the diode 452 is connected to the drain of the FET 412. The other end of the resistance 447 is grounded. The gate of the FET 415 is also connected to the gate of the RF amplifying FET 411 via a resistance 448.

The thus configured bias circuit 400 according to the fourth embodiment is formed by replacing the reference voltage source 332 in the bias circuit 300 according to the third embodiment with the dividing resistances 444 and 445. The voltage obtained by dividing the power supply voltage by the dividing resistances 444 and 445 is provided to the gate of the FET 412 as a reference voltage. Thus, the reference voltage can be generated by only the two resistances, and therefore the bias circuit 400 according to the fourth embodiment has an advantage in that its circuit configuration can be made simpler than that employing the reference voltage source.

It is to be noted that the fourth embodiment has been described by taking as an example a case where the reference voltage source 332 in the bias circuit 300 according to the third embodiment is replaced with the dividing resistances 444 and 445; however, the fourth embodiment may of course be similarly applied to the bias circuits 100 and 200 according to the first and second embodiments.

[Fifth Embodiment]

Figure 6:
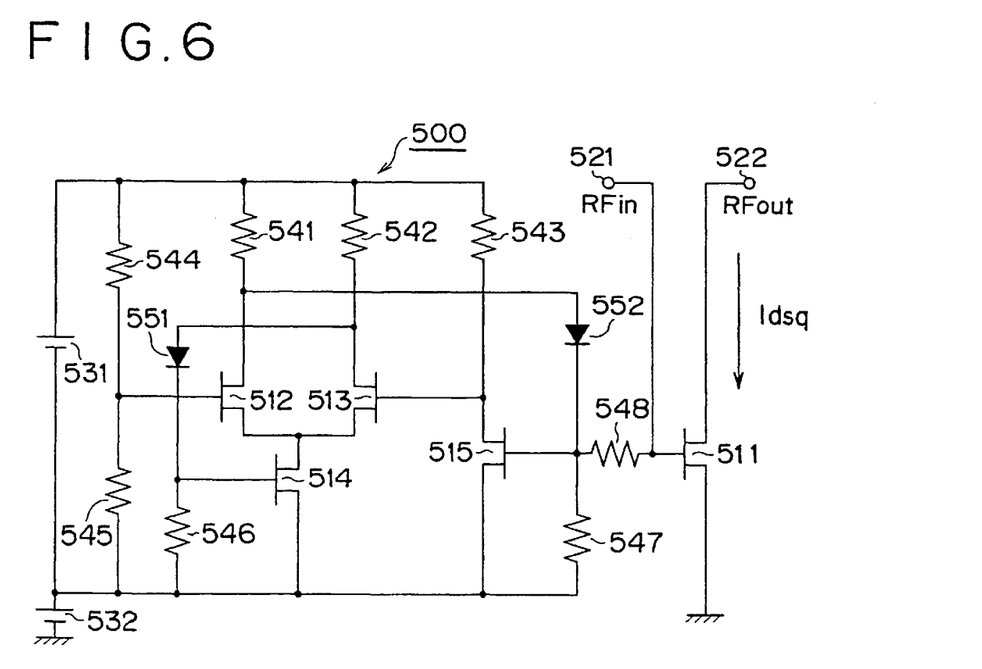
FIG. 6 is a circuit diagram of a bias circuit according to a fifth embodiment of the present invention.

FIG. 6 is a circuit diagram of a bias circuit according to a fifth embodiment of the present invention. In FIG. 6, an RF amplifying FET 511 has a source grounded, a gate connected to an input terminal 521, and a drain connected to an output terminal 522. A gate bias voltage obtained in a bias circuit 500 is applied to the gate of the RF amplifying FET 511.

In the bias circuit 500, one end of each of load resistances 541 and 542 and a current monitoring resistance 543 is connected to a common positive electrode of a reference voltage source 531. A negative electrode of the reference voltage source 531 is connected to a negative electrode of a voltage source 532. A positive electrode of the voltage source 532 is grounded. The other ends of the load resistances 541 and 542 are connected to drains of FETs 512 and 513, respectively. The FETs 512 and 513 have sources connected to a common point, and thereby form a differential pair.

A gate of the FET 512 is connected to one end of each of dividing resistances 544 and 545. The other end of the dividing resistance 544 is connected to the positive electrode of the reference voltage source 531. The other end of the dividing resistance 545 is connected to the negative electrode of the voltage source 532. A gate of the FET 513 is connected to the other end of the current monitoring resistance 543. The common source of the FETs 512 and 513 is connected to a drain of a FET 514.

The FET 514 has a source connected to the negative electrode of the voltage source 532 and a gate connected to one end of a resistance 546. The other end of the resistance 546 is connected to the negative electrode of the voltage source 532. The gate of the FET 514 is connected to a cathode of a diode 551. An anode of the diode 551 is connected to the drain of the FET 513. The The gate of the FET 513 is connected to a drain of a FET 515. A source of the FET 515 is connected to the negative electrode of the voltage source 532, while its gate is connected to a cathode of a diode 552 and one end of a resistance 547. An anode of the diode 552 is connected to the drain of the FET 512. The other end of the resistance 547 is connected to the negative electrode of the voltage source 532. The gate of the FET 515 is also connected to the gate of the RF amplifying FET 511 via a resistance 548.

The thus configured bias circuit 500 according to the fifth embodiment is formed by newly adding the voltage source 532 to the bias circuit 400 according to the fourth embodiment. The bias circuit 500 has a negative voltage on the grounded side. This makes it possible to apply not only a positive gate bias voltage but also a negative gate bias voltage to the gate of the RF amplifying FET 511.

It is to be noted that the fifth embodiment has been described by taking as an example a case where the voltage source 532 is added to the bias circuit 400 according to the fourth embodiment; however, the fifth embodiment may of course be similarly applied to the bias circuits 100, 200, and 300 according to the first, second, and third embodiments.

APPLICATION EXAMPLE

Figure 7:
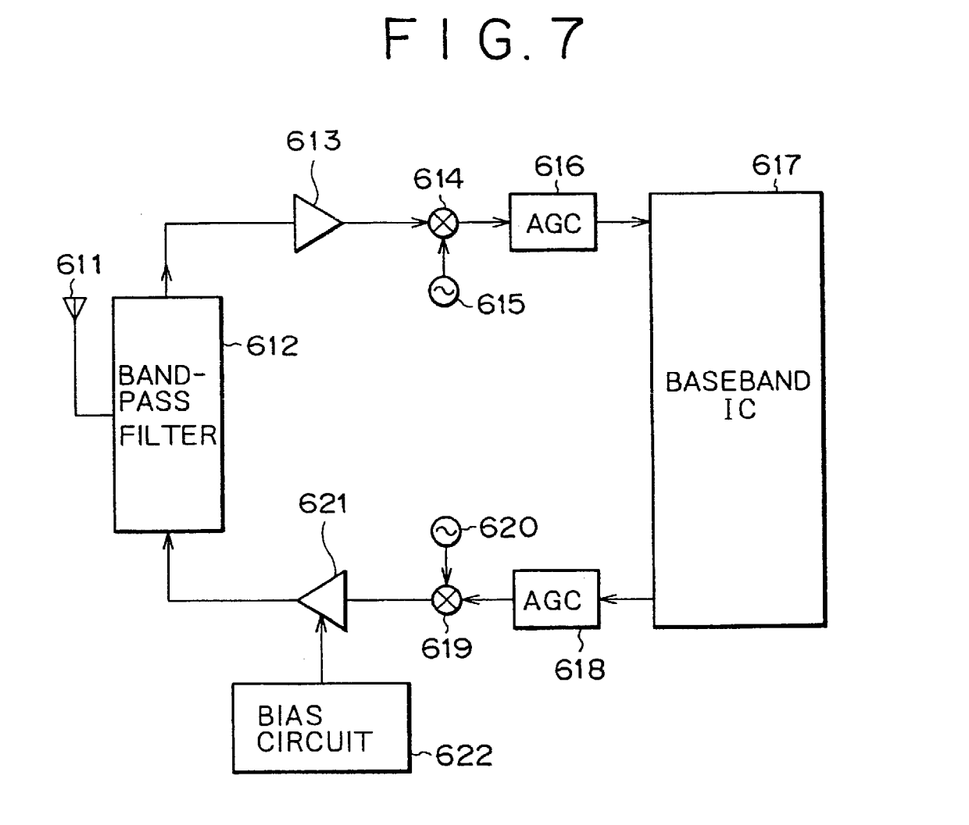
FIG. 7 is a block diagram showing a configuration of an RF front end section of a CDMA-type cellular phone system.

The bias circuits according to the first to fifth embodiments described above are used to form an amplifier in a part of an RF front end section of a CDMA-type cellular phone system, for example. FIG. 7 is a block diagram showing a configuration of the RF front end section of the CDMA-type cellular phone system.

In FIG. 7, a wave received by an antenna 611 is passed through a band-pass filter 612 used for both transmission and reception, and then supplied to a mixer 614 via a low-noise amplifier 613. The mixer 614 mixes the wave with a local oscillation frequency from a local oscillator 615 to thereby convert the wave into an intermediate frequency (IF) signal. The signal is thereafter set to a fixed level by an AGC amplifier 616, and then supplied to a baseband IC 617 in the next stage.

In the meantime, on the transmission side of the RF front end section, an IF signal supplied from the baseband IC 617 in the preceding stage is amplified by an AGC amplifier 618, and then supplied to a mixer 619, where the IF signal is mixed with a local oscillation frequency from a local oscillator 620 to be thereby converted into an RF signal. Then, the RF signal is supplied to a power amplifier 621.

The power amplifier 621 has a circuit configuration with an RF amplifying FET for amplifying the RF signal. A gate of the RF amplifying FET is supplied with a gate bias voltage from a bias circuit 622. Passing through the power amplifier 621, the RF signal goes through the band-pass filter 612 and is then transmitted from the antenna 611.

The bias circuits according to the first to fifth embodiments described above are used as the bias circuit 622 for supplying the bias voltage to the gate of the RF amplifying FET for amplifying the RF signal in the power amplifier 621 in the thus configured RF front end section of the CDMA-type cellular phone system.

Thus, the bias circuits according to the first to fifth embodiments of the present invention used as the bias circuit 622 in the transmission system of the CDMA-type cellular phone system can keep drain current constant irrespective of variation in characteristics of FETs between FET production lots and change in characteristics of FETs due to temperature variation or the like, and can also reduce current consumption to a low level. Therefore, the bias circuits can deliver stable performance at all times and can also contribute to reduction in current consumption of the cellular phone system itself.

It is to be noted that in the application example described above, the bias circuits are applied to a CDMA-type cellular phone system; however, the present invention is not limited to this application example. The bias circuits may also be employed as a bias circuit for an amplifying FET for use in radio communication systems such as cordless telephones and in digital and analog RF circuits such as RF signal measuring systems and lasers. In addition, the FET is not limited to use as an amplifier; the FET may also be applied as a multiplier and as an oscillator.

As described above, according to the present invention, when the power supply voltage or the threshold voltage of the FET deviates from a standard value, the currents of the differential pair FETs are kept equal to each other, and a voltage drop at the current monitoring resistance is accurately kept equal to the reference voltage. Therefore, it is possible to keep the idle current constant irrespective of variation in characteristics of FETs between FET production lots and change in characteristics of FETs due to temperature variation or the like, and also to reduce current consumption to a low level.

While a preferred embodiment of the invention has been described using specific terms, such description is for illustrative purposes only, and it is to be understood that changes and variations may be made without departing from the spirit or scope of the following claims.

What is claimed is:

1. A bias circuit for supplying a bias voltage to a gate of a first FET, comprising:
    a monitoring circuit having a second FET and a resistance connected to a drain of the second FET for monitoring a drain current of said first FET;
    a differential circuit including a third FET having a gate supplied with a reference voltage, a fourth FET having a gate connected to the drain of said second FET, sources of the third FET and the fourth FET being connected to a common point, and resistances connected to drains of the third FET and the fourth FET, respectively; and
    a fifth FET having a drain connected to a common source of said third FET and said fourth FET;
    wherein a drain voltage of said third FET is fed back to the gate of said first FET and a gate of said second FET, and a drain voltage of said fourth FET is fed back to a gate of said fifth FET.

2. A bias circuit as claimed in claim 1, further comprising:
    a first diode having an anode connected to the drain of said fourth FET and a cathode connected to the gate of said fifth FET; and
    a second diode having an anode connected to the drain of said third FET and a cathode connected to the gates of said first FET and said second FET.

3. A bias circuit as claimed in claim 1, further comprising a resistance or an inductor connected between the gates of said first FET and said second FET.

4. A bias circuit as claimed in claim 2, further comprising a resistance or an inductor connected between the gates of said first FET and said second FET.

5. A bias circuit as claimed in claim 1, wherein said reference voltage is supplied from a reference voltage source or a resistance division circuit for dividing power supply voltage.

6. A bias circuit as claimed in claim 2, wherein said reference voltage is supplied from a reference voltage source or a resistance division circuit for dividing power supply voltage.

7. A radio communication apparatus comprising:

an amplifying means including an RF amplifying FET for amplifying an RF signal in a transmission system thereof; and a bias circuit for supplying a bias voltage to a gate of said RF amplifying FET, said bias circuit comprising:

a monitoring circuit having a second FET and a resistance connected to a drain of the second FET for monitoring a drain current of said RF amplifying FET;

a differential circuit including a third FET having a gate supplied with a reference voltage, a fourth FET having a gate connected to the drain of said second FET, sources of the third FET and the fourth FET being connected to a common point, and resistances connected to drains of the third FET and the fourth FET, respectively; and a fifth FET having a drain connected to a common source of said third FET and said fourth FET; wherein a drain voltage of said third FET is fed back to the gate of said RF amplifying FET and a gate of said second FET, and a drain voltage of said fourth FET is fed back to a gate of said fifth FET.

8. A radio communication apparatus as claimed in claim 7, wherein said bias circuit includes a first diode having an anode connected to the drain of said fourth FET and a cathode connected to the gate of said fifth FET; and a second diode having an anode connected to the drain of said third FET and a cathode connected to the gates of said RF amplifying FET and said second FET.

9. A radio communication apparatus as claimed in claim 7, wherein said bias circuit includes a resistance or an inductor connected between the gates of said RF amplifying FET and said second FET.

10. A radio communication apparatus as claimed in claim 8, wherein said bias circuit includes a resistance or an inductor connected between the gates of said RF amplifying FET and said second FET.

* * * * *